United States Patent
Guo et al.

(10) Patent No.: US 10,203,575 B2
(45) Date of Patent: Feb. 12, 2019

(54) ARRAY SUBSTRATE AND LIQUID CRYSTAL PANEL

(71) Applicant: Shenzhen China Star Optoelectronics Technology Co., Ltd., Shenzhen, Guangdong (CN)

(72) Inventors: Jinbo Guo, Guangdong (CN); Jinjie Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 205 days.

(21) Appl. No.: 15/128,250

(22) PCT Filed: Jul. 21, 2016

(86) PCT No.: PCT/CN2016/090782
§ 371 (c)(1),
(2) Date: Sep. 22, 2016

(87) PCT Pub. No.: WO2017/219430
PCT Pub. Date: Dec. 28, 2017

(65) Prior Publication Data
US 2018/0217461 A1    Aug. 2, 2018

(30) Foreign Application Priority Data
Jun. 21, 2016  (CN) .......................... 2016 1 0455563

(51) Int. Cl.
*G02F 1/1362*   (2006.01)
*G02F 1/1368*   (2006.01)
(Continued)

(52) U.S. Cl.
CPC ....... *G02F 1/136286* (2013.01); *G02B 27/22* (2013.01); *G02F 1/1362* (2013.01);
(Continued)

(58) Field of Classification Search
CPC ......... G02F 1/136286; G02F 1/136213; G02F 1/1368; G02F 2201/121; G02F 2201/123; H01L 27/124; G02B 27/22
See application file for complete search history.

(56) References Cited

U.S. PATENT DOCUMENTS

2008/0068524 A1* 3/2008 Kim .................. G02F 1/136286
                                                  349/38
2013/0093740 A1   4/2013 Wang
(Continued)

FOREIGN PATENT DOCUMENTS

CN   101561597 A  * 10/2009  ............... G09G 3/36
CN   101561597 A    10/2009
(Continued)

*Primary Examiner* — Andrew Sasinowski
(74) *Attorney, Agent, or Firm* — Andrew C. Cheng (57) ABSTRACT

The present disclosure relates an array substrate and a liquid crystal panel. A plurality of sets of gate lines are arranged on the array substrate, each set of gate line at least includes a first gate line and a second gate line, each set of gate line is arranged corresponding to a switch unit, the switch unit is alternately applied the inputted scanning signal on the first gate line and the second gate line. Through the above-describe manner, the present disclosure is possible to resolve the problems of the image sticking and the inconsistent of the left and right eyes brightness when the large-size panel displaying the 3D image, and thus enhance the quality of 3D image.

16 Claims, 4 Drawing Sheets

(51) Int. Cl.
*H01L 27/12* (2006.01)
*G02B 27/22* (2018.01)

(52) U.S. Cl.
CPC ...... *G02F 1/1368* (2013.01); *G02F 1/136213* (2013.01); *H01L 27/124* (2013.01); *G02F 2201/121* (2013.01); *G02F 2201/123* (2013.01)

(56) References Cited

U.S. PATENT DOCUMENTS

| | | |
|---|---|---|
| 2015/0194103 A1 | 7/2015 | Li et al. |
| 2016/0043103 A1* | 2/2016 | Chen ................. G02B 5/201 359/891 |
| 2016/0247468 A1 | 8/2016 | Li et al. |
| 2017/0154593 A1 | 6/2017 | Wang |

FOREIGN PATENT DOCUMENTS

| | | |
|---|---|---|
| CN | 102148017 A | 8/2011 |
| CN | 104217694 A | 12/2014 |

\* cited by examiner

ARRAY SUBSTRATE AND LIQUID CRYSTAL PANEL

FIELD OF THE DISCLOSURE

The present disclosure relates to a liquid crystal display technology field, and more particularly to an array substrate and a liquid crystal panel.

BACKGROUND OF THE DISCLOSURE

When the vertical alignment thin film transistor liquid crystal display (VA-TFT-LCD) in large viewing angle, the color shift phenomenon is more serious and is more obvious on the large-size panel. To solve the color shift problem of the large viewing angle, the pixel design of the large-size panel is often designed by the pixel design of low color shift (FIG. 1), the pixel is divided into main pixel area and sub pixel area, the Gla and the G1b are sequentially opening when charging, when the G1a is opening and the G1b is closing, the main pixel area and the sub pixel area charging at the same time and the voltages are the same; thereafter, when the Gal is closing and the G1b is opening, charging the capacitor Cst arranged at the sub pixel area and the voltage of the sub pixel area is decreased, the different potentials make the different steering distribution of the liquid crystal molecules, which have improved the effect of the large viewing angle color shift, wherein the capacitance value of the capacitor Cst determines the ultimate potential and the display luminance of the sub pixel area, and directly affects the effect of low color shift.

Figure 1:
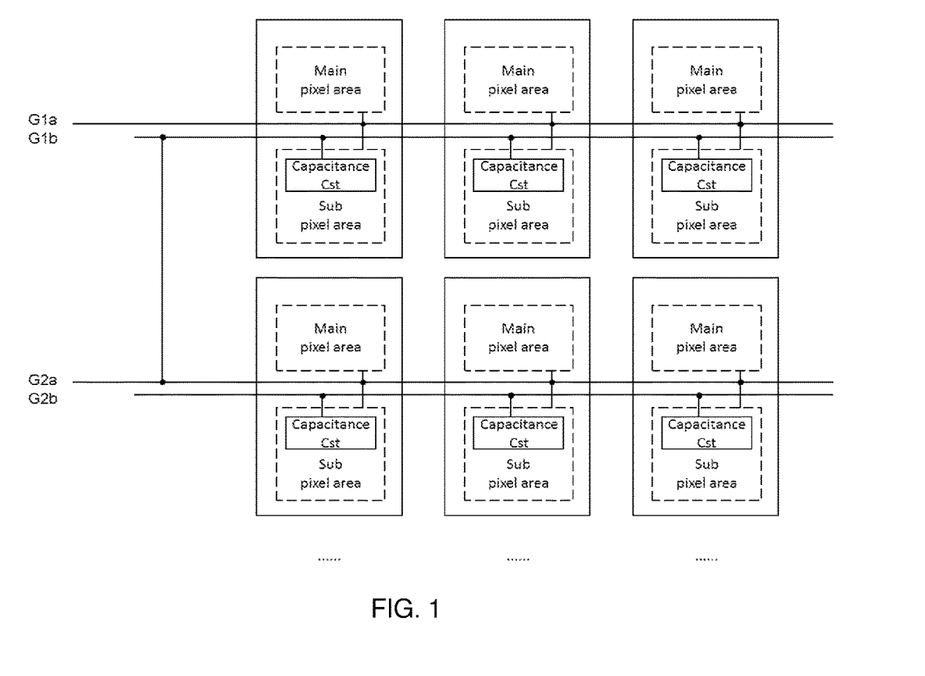
FIG. 1 is a schematic diagram of the array substrate of the prior art.

In the pixel design of low color shift shown in FIG. 1, a pixel corresponds two gate lines, in order to save the costs, reduce the number of the gate driving chips, connecting the shared gate signal G1b and the charging gate signal G2a of the adjacent pixel together, so that the number of the driving chips in the panel can be reduced.

Figure 2:
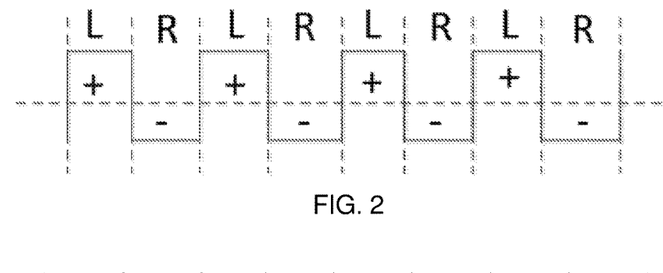
FIG. 2 is a time chart of the driving method of the single frame reverse.
Figure 3:
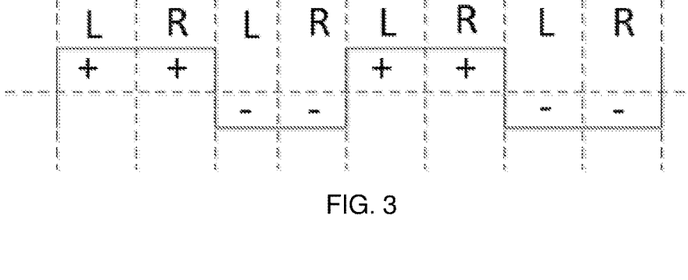
FIG. 3 is a time chart of the driving method of the double frame reverse.

However, with the above driving method, when the large-size panel opening the 3D function, one frame screen is to the left eye, one frame screen is to the right eye, when using the driving method of the single frame i.e. one frame reverse (FIG. 2), "L" is left eye signal and "R" is right eye signal, the left eye received signal are all "+" and the right eye received signal are all "−", the positive and the negative signals cannot be completely equal, the panel display appears the image sticking phenomenon. When using the driving method of the double frame i.e. two frame reverse (FIG. 3), the panel does not have the image sticking phenomenon, however, since the polarity change of the left and right eye signal, the left eye received signal is "+" →"−" or "−" →"+", the low color washout function is properly at this time, the right eye received signal is "+" →"+" or "−" →"−", the low color washout function is dysfunction, the pixel partial bright, result in the brightness of the left and right eyes are inconsistent, the image is reduced.

SUMMARY OF THE DISCLOSURE

The object of the present disclosure is provides an array substrate and a liquid crystal panel to solve the large-size panel problems of the image sticking and the left and right eye brightness inconsistent when displaying 3D images, and thus enhance the quality of 3D images.

To achieve the above objects, one aspect of the present disclosure used is: providing an array substrate, a plurality of sets of gate lines are arranged on the array substrate, each set of gate line at least includes a first gate line and a second gate line, each set of gate line is arranged corresponding to a switch unit, the switch unit is alternately applied the inputted scanning signal on the first gate line and the second gate line; wherein, the switch unit includes a first switch tube and a second switch tube, wherein the input terminal of the first switch tube is connected with the input terminal of the second switch tube and is used to receive the scanning signal, the output terminal of the first switch tube and the output terminal of the second switch tube are connected with the first gate line and the second gate line respectively, the control terminal of the first switch tube is connected with a first switch control line and is used to receive a first switch control signal, the control terminal of the second switch tube is connected with a second switch control line and is used to receive a second switch control signal, wherein the first switch control signal and the second switch control signal are set to make the first switch tube and the second switch tube alternately conducted; wherein, further arranged a plurality of pixels in a matrix manner on the array substrate, each row of pixel corresponding to a set of the gate line.

Wherein, the first switch tube and the second switch tube are thin film transistors.

To achieve the above objects, another aspect of the present disclosure used is: providing an array substrate, a plurality of sets of gate lines are arranged on the array substrate, each set of gate line at least includes a first gate line and a second gate line, each set of gate line is arranged corresponding to a switch unit, the switch unit is alternately applied the inputted scanning signal on the first gate line and the second gate line.

Wherein, the switch unit includes a first switch tube and a second switch tube, wherein the input terminal of the first switch tube is connected with the input terminal of the second switch tube and is used to receive the scanning signal, the output terminal of the first switch tube and the output terminal of the second switch tube are connected with the first gate line and the second gate line respectively, the control terminal of the first switch tube is connected with a first switch control line and is used to receive a first switch control signal, the control terminal of the second switch tube is connected with a second switch control line and is used to receive a second switch control signal, wherein the first switch control signal and the second switch control signal are set to make the first switch tube and the second switch tube alternately conducted.

Wherein, the first switch tube and the second switch tube are thin film transistors.

Wherein, the first switch control signal and the second switch control signal are set to control the first switch tube and the second switch tube alternately conducted in the duration of a same scanning signal, such that the same scanning signal can be applied on the first gate line and the second gate line respectively.

Wherein, the array substrate further includes a gate driver and a switch controller, the gate driver sequentially provides the scanning signal to the switch unit, the switch controller alternately provides the first switch control signal and the second switch control signal to the first switch control line and the second switch control line, so that the scanning signal along a predetermined direction sequentially applies the first gate line and the second gate line to the plurality of sets of gate lines.

Wherein, further arranged a plurality of pixels in a matrix manner on the array substrate, each row of pixel corresponding to a set of the gate line.

Wherein, the pixel includes a main pixel area corresponding to one side of one set of the gate line and a sub pixel area corresponding to another side of the set of the gate line, the first gate line is used to control the main pixel area and the sub pixel area obtaining the same data voltage, the second gate line is used to voltage regulate the sub pixel area, so that the data voltage of the sub pixel area is different from the main pixel area.

Wherein, further arranged a data line, a common electrode, a first switch control tube, a second switch control tube and a third switch control tube, a main pixel electrode is arranged on the main pixel area, a sub pixel electrode is arranged on the sub pixel area, the main pixel electrode is formed a first storage capacitor with the common electrode, the sub pixel electrode is formed a second storage capacitor with the common electrode, the control terminal of the first switch control tube and the control terminal of the second switch control tube connect the first gate line, the input terminal of the first switch control tube and the input terminal of the second switch control tube connect the data line, the output terminal of the first switch control tube and the output terminal of the second switch control tube connect the main pixel electrode and the sub pixel electrode respectively, furthermore when the first gate line applying the scanning signal, the data line applies the same data voltage to the main pixel electrode and the sub pixel electrode respectively through the first switch control tube and the second switch control tube, the control terminal of the third switch control tube connects the second gate line, the input terminal of the third switch control tube connects the sub pixel electrode, the output terminal of the third switch control tube further forms a third storage capacitor with the common electrode, furthermore when the second gate line applying the scanning signal, the second storage capacitor discharging to the third storage capacitor.

Wherein, the first switch control tube, the second switch control tube and the third switch control tube are thin film transistors.

To achieve the above objects, other aspect of the present disclosure used is: providing a liquid crystal panel, the liquid crystal panel includes the above array substrate, the opposite substrate arranged corresponding to the array substrate and the liquid crystal layer between the two; a plurality of sets of gate lines are arranged on the array substrate, each set of gate line at least includes a first gate line and a second gate line, each set of gate line is arranged corresponding to a switch unit, the switch unit is alternately applied the inputted scanning signal on the first gate line and the second gate line.

Wherein, the switch unit includes a first switch tube and a second switch tube, wherein the input terminal of the first switch tube is connected with the input terminal of the second switch tube and is used to receive the scanning signal, the output terminal of the first switch tube and the output terminal of the second switch tube are connected with the first gate line and the second gate line respectively, the control terminal of the first switch tube is connected with a first switch control line and is used to receive a first switch control signal, the control terminal of the second switch tube is connected with a second switch control line and is used to receive a second switch control signal, wherein the first switch control signal and the second switch control signal are set to make the first switch tube and the second switch tube alternately conducted.

Wherein, the first switch tube and the second switch tube are thin film transistors.

Wherein, the first switch control signal and the second switch control signal are set to control the first switch tube and the second switch tube alternately conducted in the duration of a same scanning signal, such that the same scanning signal can be applied on the first gate line and the second gate line respectively.

Wherein, the array substrate further includes a gate driver and a switch controller, the gate driver sequentially provides the scanning signal to the switch unit, the switch controller alternately provides the first switch control signal and the second switch control signal to the first switch control line and the second switch control line, so that the scanning signal along a predetermined direction sequentially applies the first gate line and the second gate line to the plurality of sets of gate lines.

Wherein, further arranged a plurality of pixels in a matrix manner on the array substrate, each row of pixel corresponding to a set of the gate line.

Wherein, the pixel includes a main pixel area corresponding to one side of one set of the gate line and a sub pixel area corresponding to another side of the set of the gate line, the first gate line is used to control the main pixel area and the sub pixel area obtaining the same data voltage, the second gate line is used to voltage regulate the sub pixel area, so that the data voltage of the sub pixel area is different from the main pixel area.

Wherein, further arranged a data line, a common electrode, a first switch control tube, a second switch control tube and a third switch control tube, a main pixel electrode is arranged on the main pixel area, a sub pixel electrode is arranged on the sub pixel area, the main pixel electrode is formed a first storage capacitor with the common electrode, the sub pixel electrode is formed a second storage capacitor with the common electrode, the control terminal of the first switch control tube and the control terminal of the second switch control tube connect the first gate line, the input terminal of the first switch control tube and the input terminal of the second switch control tube connect the data line, the output terminal of the first switch control tube and the output terminal of the second switch control tube connect the main pixel electrode and the sub pixel electrode respectively, furthermore when the first gate line applying the scanning signal, the data line applies the same data voltage to the main pixel electrode and the sub pixel electrode respectively through the first switch control tube and the second switch control tube, the control terminal of the third switch control tube connects the second gate line, the input terminal of the third switch control tube connects the sub pixel electrode, the output terminal of the third switch control tube further forms a third storage capacitor with the common electrode, furthermore when the second gate line applying the scanning signal, the second storage capacitor discharging to the third storage capacitor.

Wherein, the first switch control tube, the second switch control tube and the third switch control tube are thin film transistors.

The beneficial effects of the present disclosure are: the situation is different from the prior art, the array substrate and the liquid crystal panel of the present disclosure are arranged a plurality of sets of gate lines, each set of gate line at least includes a first gate line and a second gate line, each set of gate line is arranged corresponding to a switch unit, the switch unit is alternately applied the inputted scanning signal on the first gate line and the second gate line. Through the above-describe manner, the present disclosure is possible to resolve the problems of the image sticking and the inconsistent of the left and right eyes brightness when the large-size panel displaying the 3D image, and thus enhance the quality of 3D image.

DETAILED DESCRIPTION OF PREFERRED EMBODIMENTS

In order that those skilled in the art to better understand the technical aspect of the present disclosure, the accompanying drawings and the following specific embodiments of the present disclosure, the array substrate and the liquid crystal panel will be described in detail.

Figure 4:
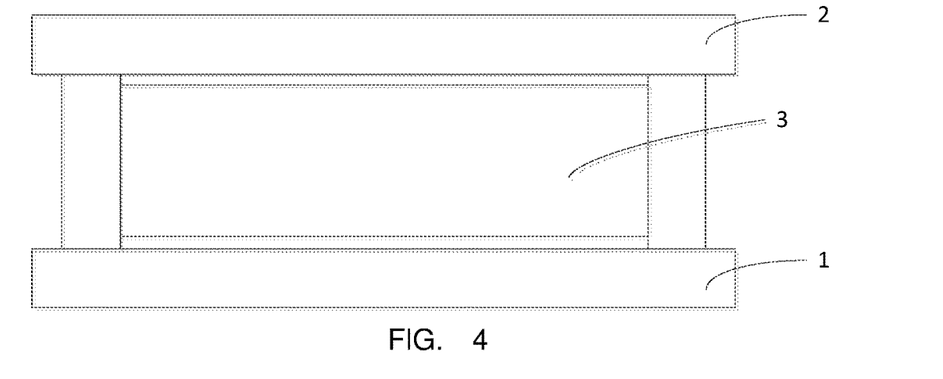
FIG. 4 is a schematic diagram of the liquid crystal panel of the present disclosure embodiment.

FIG. 4 is a schematic diagram of the liquid crystal panel of the present disclosure embodiment. Shown in FIG. 4, the liquid crystal panel includes an array substrate 1, an opposite substrate arranged corresponding to the array substrate 1 and a liquid crystal layer 3 between the array substrate 1 and the opposite substrate 2. Wherein, the opposite substrate 2 may be a color filter substrate in the liquid crystal panel.

Figure 5:
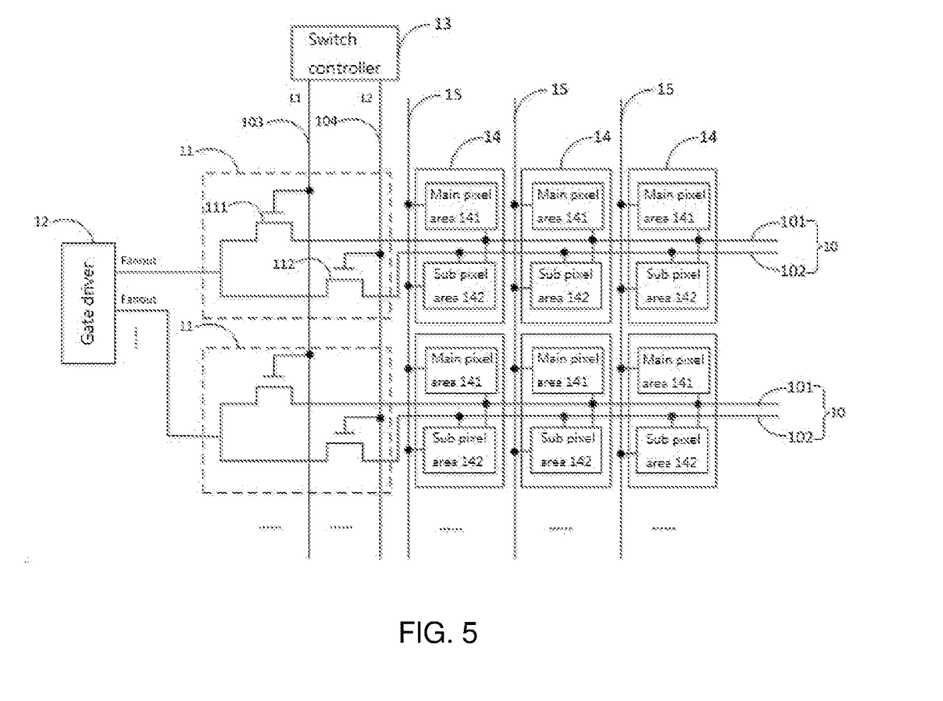
FIG. 5 is a schematic diagram of one embodiment of the array substrate in the liquid crystal panel shown in FIG. 4.

FIG. 5 is a schematic diagram of one embodiment of the array substrate in the liquid crystal panel. As shown in FIG. 4, the array substrate 1 includes a plurality of sets of the gate lines 10, a plurality of switch units 11, a gate driver 12, and a switch controller 13, a plurality of pixels 14 arranged in a matrix manner and a plurality of data lines 15.

Wherein, each set of gate line 10 at least includes a first gate line 101 and a second gate line 102, each switch unit 11 corresponds a set of gate line 10.

Wherein, the gate driver 12 connecting with the each switch unit 11 is used to provide a scanning signal Fanout to the each switch unit 11 sequentially. Specifically, the gate driver 12 includes a plurality of gate driving chips, each driving chip provides a scanning signal Fanout. The switch unit 11 connecting with the corresponding first gate line 101 and the corresponding second gate line 102 respectively is used to alternately apply the inputted scanning signal Fanout on the first gate line 101 and the second gate line 102.

Specifically, the switch unit 11 includes a first switch tube 111 and a second switch tube 112. Preferably, the first switch tube 111 and the second switch tube 112 are thin film transistors.

Wherein, the input terminal of the first switch tube 111 is connected with the input terminal of the second switch tube 112 and is used to receive the scan signal Fanout, the output terminal of the first switch tube 111 and the output terminal of the second switch tube 112 are connected with the first gate line 101 and the second gate line 102 respectively, the control terminal of the first switch tube 111 is connected with a first switch control line 103 and is used to receive a first switch control signal L1, the control terminal of the second switch tube 112 is connected with a second switch control line 104 and is used to receive a second switch control signal L2.

The switch controller 13 connected with the first switch control line 103 and the second switch control line 104 respectively is used to alternately provide the first switch control signal L1 and the second switch control signal L2 to the first switch control line 103 and the second switch control line 104, so that the scanning signal Fanout along a predetermined direction sequentially applies the first gate line 101 and the second gate line 102 to the plurality of sets of gate lines 10.

Specifically, the first switch control signal L1 and the second switch control signal L2 are set to make the first switch tube 111 and the second switch tube 112 alternately conducted. Preferably, the first switch control signal L1 and the second switch control signal L2 are set to control the first switch tube 111 and the second switch tube 112 alternately conducted in the duration of a same scanning signal Fanout, such that the same scanning signal Fanout can be applied on the first gate line 101 and the second gate line 102 respectively.

Each row of pixel corresponds a set of the gate line 10, each column pixel corresponds a data line 15. Specifically, each pixel 14 includes a main pixel area 141 corresponding to one side of one set of the gate line 10 and a sub pixel area 142 corresponding to another side of the set of the gate line 10, the first gate line 101 is used to control the main pixel area 141 and the sub pixel area 142 obtaining the same data voltage, the second gate line 102 is used to voltage regulate the sub pixel area 142, so that the data voltage of the sub pixel area 142 is different from the main pixel area 141.

Figure 6:
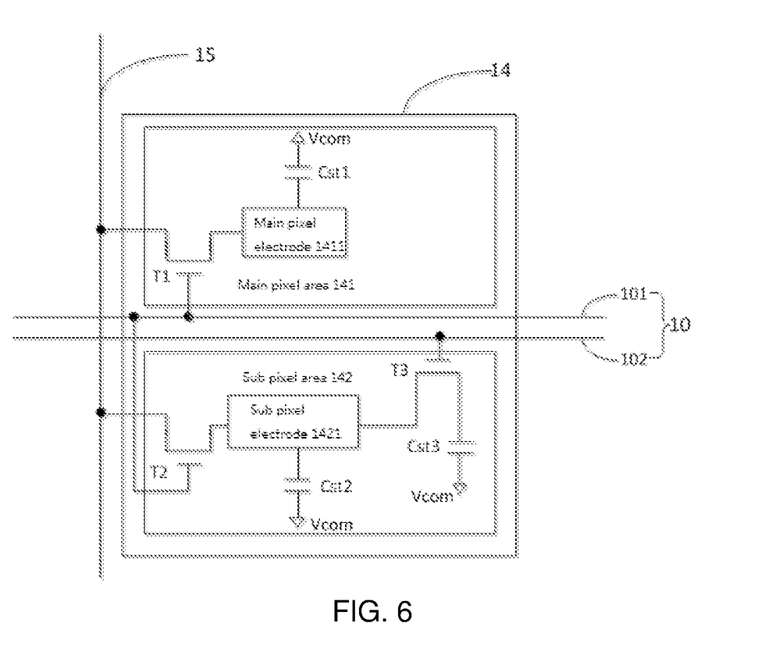
FIG. 6 is a specific circuit diagram of each pixel in the array substrate shown in FIG. 5.

Please refer to FIG. 6 together, FIG. 6 is a specific circuit diagram of each pixel in the array substrate shown in FIG. 5. As shown in FIG. 6, further arranged a common electrode Vcom, a first switch control tube T1, a second switch control tube T2 and a third switch control tube T3.

Wherein, the pixel 14 includes a main pixel area 141 and a sub pixel area 142. Specifically, the main pixel area 141 is arranged a main pixel electrode 1411, the main pixel electrode 1411 is formed a first storage capacitor Cst1 with the common electrode Vcom, the sub pixel area 142 is arranged a sub pixel electrode 1421, the sub pixel electrode 1421 is formed a second storage capacitor Cst2 with the common electrode Vcom.

The control terminal of the first switch control tube T1 and the control terminal of the second switch control tube T2 connect the first gate line 101, the input terminal of the first switch control tube T1 and the input terminal of the second switch control tube T2 connect the data line 15, the output terminal of the first switch control tube T1 and the output terminal of the second switch control tube T2 connect the main pixel electrode 1411 and the sub pixel electrode 1421 respectively, furthermore when the first gate line 101 applying the scanning signal Fanout, the data line 15 applies the same data voltage to the main pixel electrode 1411 and the sub pixel electrode 1421 respectively through the first switch control tube T1 and the second switch control tube T2. The control terminal of the third switch control tube T3 connects the second gate line 102, the input terminal of the third switch control tube T3 connects the sub pixel electrode 1421, the output terminal of the third switch control tube T3 further forms a third storage capacitor Cst3 with the common electrode Vcom, furthermore when the second gate line 102 applying the scanning signal Fanout, the second storage capacitor Cst2 discharging to the third storage capacitor Cst3.

Preferably, the first switch control tube T1, the second switch control tube T2 and the third switch control tube T3 are thin film transistors.

Figure 7:
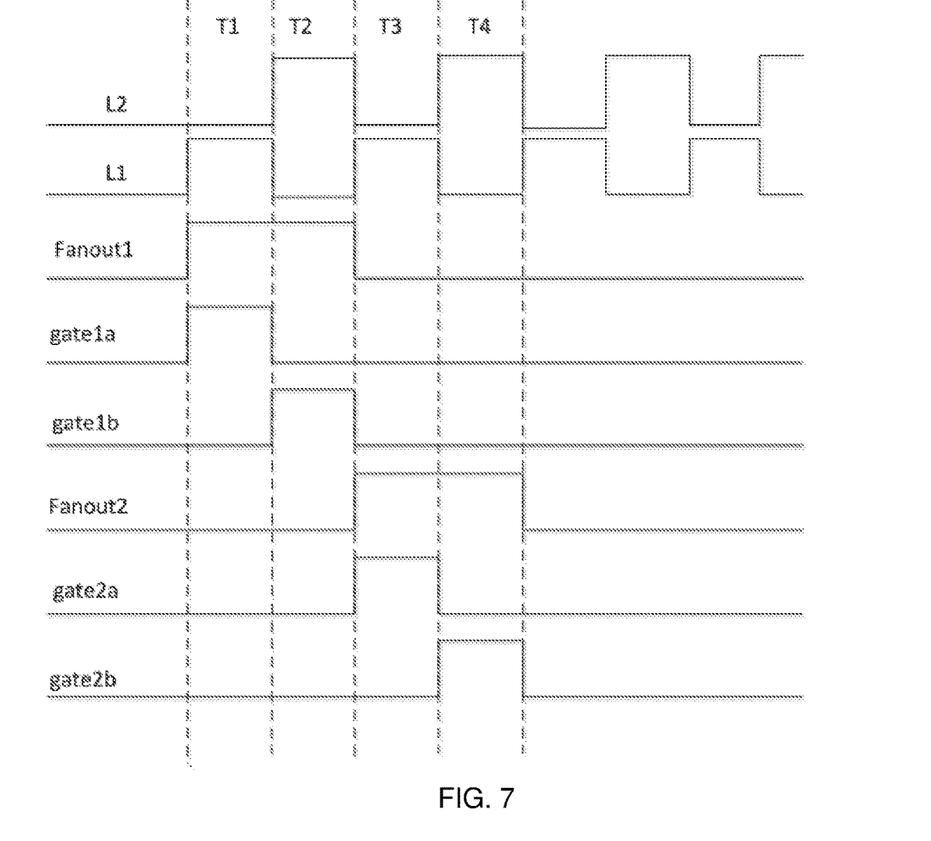
FIG. 7 is a working time chart of the array substrate shown in FIG. 5.

Please refer to FIG. 7, FIG. 7 is a working time chart of the array substrate shown in FIG. 5. Wherein, the working time chart using the two adjacent row pixels is described as an example, the gate driver 12 outputting to the scanning signal Fanout of the first row pixel is referred to as Fanout1, the gate driver 12 outputting to the scanning signal Fanout of the second row pixel is referred to as Fanout2, the signal outputted by the first gate line 101 and the second gate line 12 corresponding to the first row pixel are referred to as gate1a and gate1b respectively, the signal outputted by the first gate line 101 and the second gate line 12 corresponding to the second row pixel are referred to as gate2a and gate2b respectively.

As shown in FIG. 4, the scanning signal Fanout of the gate driver 12 provided to the each switch unit 11 sequentially is a high level signal lasts for two cycles. That is, in the T1 and T2 period, the scanning signal Fanout1 is high level signal, the scanning signal Fanout2 is low level signal; in the T3 and T4 period, the scanning signal Fanout1 is low level signal, and the scanning signal Fanout2 is high level signal.

In the T1 period, the first switch control signal L1 of the switch controller 13 outputted is high level signal, and the second switch control signal L2 is low level signal, so that the first switch tube 111 in the each switch unit 11 is turned on, the second switch tube 112 is turned off. Since the scanning signal Fanout1 of the first row pixel received is high level, thus making the signal gate1a on the first gate line 101 corresponding to the first row pixel is high level, the other three signals gate1b, gate2a and gate2b are low level, in order to achieve the data line 15 charging to the main pixel area 141 and the sub pixel area 142 in the first row pixel respectively at the same time.

In the T2 period, the first switch control signal L1 of the switch controller 13 outputted is low level signal, the second switch control signal L2 is high level signal, so that the first switch tube 111 in the each switch unit 11 is turned off, the second switch tube 112 is turned on. Since the scanning signal Fanout1 of the first row pixel received is high level, thus making the signal gate1b on the second gate line 102 corresponding to the first row pixel is high level, the other three signals gate1a, gate2a and gate2b are low level, in order to achieve the low voltage of the sub pixel area 142 in the first row pixel.

In the T3 period, the first switch control signal L1 of the switch controller 13 outputted is high level signal, the second switch control signal L2 is low level signal, so that the first switch tube 111 in the each switch unit 11 is turned on, the second switch tube 112 is turned off. Since the scanning signal Fanout2 of the second row pixel received is high level, thus making the signal gate2a on the first gate line 101 corresponding to the second row pixel is high level, the other three signal gate1a, gate1b and gate2b are low level, in order to achieve the data line 15 charging to the main pixel area 141 and the sub pixel area 142 in the second row pixel respectively at the same time.

In the T4 period, the first switch control signal L1 of the switch controller 13 outputted is low level signal, the second switch control signal L2 is high level signal, so that the first switch tube 111 in the each switch unit 11 is turned off, the second switch tube 112 is turned on. Since the scanning signal Fanout2 of the first row pixel received is high level, thus making the signal gate2b on the second gate line 102 corresponding to the second row pixel is high level, the other three signals gate1a, gate2a and gate2a are low level, in order to achieve the low voltage of the sub pixel area 142 in the first row pixel.

Each subsequent row pixel and so on, in order to achieve the progressive scan of the pixel.

Compared with the prior art, the first scanning signal in the present disclosure i.e. the charging gate signal and the second scanning signal i.e. the shared gate signal are controlled independently of each other, rather than the shared gate signal and the charging gate signal in the prior art are connected together, so that it will not be appeared the problem of the image sticking and the inconsistent between the left and right eye brightness in the prior art.

The beneficial effects of the present disclosure are: the situation is different from the prior art, the array substrate and the liquid crystal panel of the present disclosure are arranged a plurality of sets of gate lines, each set of gate line at least includes a first gate line and a second gate line, each set of gate line is arranged corresponding to a switch unit, the switch unit is alternately applied the inputted scanning signal on the first gate line and the second gate line. Through the above-describe manner, since the first gate line i.e. charging gate signal and the second gate line i.e. shared gate signal are controlled independently of each other, it is possible to resolve the problems of the image sticking and the inconsistent of the left and right eyes brightness when the large-size panel displaying the 3D image, and thus enhance the quality of 3D image.

The above-described embodiments of the disclosure only, and not so to limit the patent scope of the present disclosure, any use of the accompanying drawings and the description of the present disclosure is made equivalent structures or equivalent processes transform, or direct or indirect use in other Related technical fields, are included within the same reason patentable scope of the disclosure.

What is claimed is:

1. An array substrate, wherein, a plurality of sets of gate lines are arranged on the array substrate, each set of gate line at least comprises a first gate line and a second gate line, each set of gate line is arranged corresponding to a switch unit, the switch unit is alternately applied the inputted scanning signal on the first gate line and the second gate line;

wherein, the pixel comprises a main pixel area corresponding to one side of one set of the gate line and a sub pixel area corresponding to another side of the set of the gate line, the first gate line is used to control the main pixel area and the sub pixel area obtaining the same data voltage, the second gate line is used to voltage regulate the sub pixel area, so that the data voltage of the sub pixel area is different from the main pixel area.

2. The array substrate according to claim 1, wherein, the switch unit comprises a first switch tube and a second switch tube, the input terminal of the first switch tube is connected with the input terminal of the second switch tube and is used to receive the scanning signal, the output terminal of the first switch tube and the output terminal of the second switch tube are connected with the first gate line and the second gate line respectively, the control terminal of the first switch tube is connected with a first switch control line and is used to receive a first switch control signal, the control terminal of the second switch tube is connected with a second switch control line and is used to receive a second switch control signal, wherein the first switch control signal and the second switch control signal are set to make the first switch tube and the second switch tube alternately conducted.

3. The array substrate according to claim 2, wherein, the first switch tube and the second switch tube are thin film transistors.

4. The array substrate according to claim 3, wherein, the first switch control signal and the second switch control signal are set to control the first switch tube and the second switch tube alternately conducted in the duration of a same scanning signal, such that the same scanning signal can be applied on the first gate line and the second gate line respectively.

5. The array substrate according to claim 4, wherein, the array substrate further comprises a gate driver and a switch controller, the gate driver sequentially provides the scanning signal to the switch unit, the switch controller alternately provides the first switch control signal and the second switch control signal to the first switch control line and the second switch control line, so that the scanning signal along a predetermined direction sequentially applies the first gate line and the second gate line to the plurality of sets of gate lines.

6. The array substrate according to claim 1, wherein, further arranged a plurality of pixels in a matrix manner on the array substrate, each row of pixel corresponding to a set of the gate line.

7. The array substrate according to claim 1, wherein, further arranged a data line, a common electrode, a first switch control tube, a second switch control tube and a third switch control tube, a main pixel electrode is arranged on the main pixel area, a sub pixel electrode is arranged on the sub pixel area, the main pixel electrode is formed a first storage capacitor with the common electrode, the sub pixel electrode is formed a second storage capacitor with the common electrode, the control terminal of the first switch control tube and the control terminal of the second switch control tube connect the first gate line, the input terminal of the first switch control tube and the input terminal of the second switch control tube connect the data line, the output terminal of the first switch control tube and the output terminal of the second switch control tube connect the main pixel electrode and the sub pixel electrode respectively, furthermore when the first gate line applying the scanning signal, the data line applies the same data voltage to the main pixel electrode and the sub pixel electrode respectively through the first switch control tube and the second switch control tube, the control terminal of the third switch control tube connects the second gate line, the input terminal of the third switch control tube connects the sub pixel electrode, the output terminal of the third switch control tube further forms a third storage capacitor with the common electrode, furthermore when the second gate line applying the scanning signal, the second storage capacitor discharging to the third storage capacitor.

8. The array substrate according to claim 7, wherein, the first switch control tube, the second switch control tube and the third switch control tube are thin film transistors.

9. A liquid crystal panel, wherein the liquid crystal panel comprises an array substrate, an opposite substrate arranged corresponding to the array substrate and a liquid crystal layer between the two; wherein, a plurality of sets of gate lines are arranged on the array substrate, each set of gate line at least comprises a first gate line and a second gate line, each set of gate line is arranged corresponding to a switch unit, the switch unit is alternately applied the inputted scanning signal on the first gate line and the second gate line;
wherein the pixel comprises a main pixel area corresponding to one side of one set of the gate line and a sub pixel area corresponding to another side of the set of the gate line, the first gate line is used to control the main pixel area and the sub pixel area obtaining the same data voltage, the second gate line is used to voltage regulate the sub pixel area, so that the data voltage of the sub pixel area is different from the main pixel area.

10. The liquid crystal panel according to claim 9, wherein the switch unit comprises a first switch tube and a second switch tube, wherein the input terminal of the first switch tube is connected with the input terminal of the second switch tube and is used to receive the scanning signal, the output terminal of the first switch tube and the output terminal of the second switch tube are connected with the first gate line and the second gate line respectively, the control terminal of the first switch tube is connected with a first switch control line and is used to receive a first switch control signal, the control terminal of the second switch tube is connected with a second switch control line and is used to receive a second switch control signal, wherein the first switch control signal and the second switch control signal are set to make the first switch tube and the second switch tube alternately conducted.

11. The liquid crystal panel according to claim 10, wherein the first switch tube and the second switch tube are thin film transistors.

12. The liquid crystal panel according to claim 11, wherein the first switch control signal and the second switch control signal are set to control the first switch tube and the second switch tube alternately conducted in the duration of a same scanning signal, such that the same scanning signal can be applied on the first gate line and the second gate line respectively.

13. The liquid crystal panel according to claim 12, wherein the array substrate further comprises a gate driver and a switch controller, the gate driver sequentially provides the scanning signal to the switch unit, the switch controller alternately provides the first switch control signal and the second switch control signal to the first switch control line and the second switch control line, so that the scanning signal along a predetermined direction sequentially applies the first gate line and the second gate line to the plurality of sets of gate lines.

14. The liquid crystal panel according to claim 9, wherein further arranged a plurality of pixels in a matrix manner on the array substrate, each row of pixel corresponding to a set of the gate line.

15. The liquid crystal panel according to claim 9, wherein further arranged a data line, a common electrode, a first switch control tube, a second switch control tube and a third switch control tube, a main pixel electrode is arranged on the main pixel area, a sub pixel electrode is arranged on the sub pixel area, the main pixel electrode is formed a first storage capacitor with the common electrode, the sub pixel electrode is formed a second storage capacitor with the common electrode, the control terminal of the first switch control tube and the control terminal of the second switch control tube connect the first gate line, the input terminal of the first switch control tube and the input terminal of the second switch control tube connect the data line, the output terminal of the first switch control tube and the output terminal of the second switch control tube connect the main pixel electrode and the sub pixel electrode respectively, furthermore when the first gate line applying the scanning signal, the data line applies the same data voltage to the main pixel electrode and the sub pixel electrode respectively through the first switch control tube and the second switch control tube, the control terminal of the third switch control tube connects the second gate line, the input terminal of the third switch control tube connects the sub pixel electrode, the output terminal of the third switch control tube further forms a third storage capacitor with the common electrode, furthermore when the second gate line applying the scanning signal, the second storage capacitor discharging to the third storage capacitor.

16. The liquid crystal panel according to claim 15, wherein the first switch control tube, the second switch control tube and the third switch control tube are thin film transistors.

* * * * *